United States Patent
Tsukiji et al.

(10) Patent No.: US 6,807,206 B2
(45) Date of Patent: Oct. 19, 2004

(54) SEMICONDUCTOR LASER DEVICE AND DRIVE CONTROL METHOD FOR A SEMICONDUCTOR LASER DEVICE

(75) Inventors: Naoki Tsukiji, Tokyo (JP); Toshio Kimura, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 165 days.

(21) Appl. No.: 09/931,257

(22) Filed: Aug. 17, 2001

(65) Prior Publication Data

US 2002/0150131 A1 Oct. 17, 2002

(30) Foreign Application Priority Data

Apr. 16, 2001 (JP) ........................................ 2001-117446

(51) Int. Cl.[7] ................................................ H01S 3/04
(52) U.S. Cl. ........................................ 372/34; 372/36
(58) Field of Search ................................ 372/34, 36

(56) References Cited

U.S. PATENT DOCUMENTS

| | | | | |
|---|---|---|---|---|
| 5,042,042 A | * | 8/1991 | Hori et al. | 372/32 |
| 5,438,579 A | * | 8/1995 | Eda et al. | 372/34 |
| 5,602,475 A | * | 2/1997 | Bohler | 324/301 |
| 5,684,590 A | | 11/1997 | Sanders et al. | 356/350 |
| 5,754,574 A | | 5/1998 | Lofthouse-Zeis et al. | 372/34 |
| 6,101,200 A | * | 8/2000 | Burbidge et al. | 372/29.021 |
| 6,192,170 B1 | * | 2/2001 | Komatsu | 385/15 |
| 6,229,832 B1 | * | 5/2001 | Baba et al. | 372/38.01 |
| 6,384,963 B2 | | 5/2002 | Ackerman et al. | |
| 6,393,041 B1 | * | 5/2002 | Sato | 372/29.021 |

FOREIGN PATENT DOCUMENTS

| | | |
|---|---|---|
| DE | 37 06 635 | 9/1988 |
| DE | 198 28 437 | 2/2000 |
| EP | 0 618 653 | 10/1994 |
| EP | 0 813 272 | 12/1997 |
| EP | 0 920 095 | 6/1999 |

* cited by examiner

*Primary Examiner*—Don Wong
*Assistant Examiner*—Leith Al-Nazer
(74) *Attorney, Agent, or Firm*—Oblon, Spivak, McClelland, Maier & Neustadt, P.C.

(57) ABSTRACT

A semiconductor laser device including a semiconductor laser element, a temperature measuring element to measure a temperature, and a temperature regulating unit having the laser element and the temperature measuring element thermally connected thereto. The laser device includes a current detecting unit to detect a driving current applied to the laser element, and a control unit to control the temperature regulating unit using a control function to achieve a substantially constant wavelength output from the laser element. The control function defines a relationship between a predetermined driving current and a predetermined temperature. The control unit is configured to control the temperature regulating unit such that the detected temperature substantially equals the predetermined temperature corresponding to the detected driving current as defined by the control function.

36 Claims, 8 Drawing Sheets

SEMICONDUCTOR LASER DEVICE AND DRIVE CONTROL METHOD FOR A SEMICONDUCTOR LASER DEVICE

BACKGROUND OF THE INVENTION

1. Field of the Invention

The present invention relates to a technology used in a light source for exciting an optical fiber amplifier and capable of producing a laser beam of a stable wavelength.

2. Description of the Background

Conventionally, semiconductor laser devices producing laser beams as signal lights use a distribution feedback (DFB) type laser element incorporating a diffraction grating. Since a signal light is being produced, a wavelength of the signal light must be highly precise (e.g., ±0.1 nm or less). However, the wavelength of the signal light of such semiconductor laser devices are typically not stable. Accordingly, such laser devices require the use of a "wavelength lock device." The wavelength lock device controls and monitors the wavelength of the laser beam produced by the laser device. The wavelength lock device controls the wavelength of the laser beam through feedback so that the monitored wavelength may be a desired wavelength, thereby producing a laser beam of a stable wavelength.

The wavelength lock device described above requires a large, complicated, and expensive optical system and control unit to monitor the wavelength of produced laser beam. Accordingly, it is difficult to reduce the size, weight, and cost of the semiconductor laser device.

Semiconductor laser devices producing laser beams as light sources for exciting Raman amplifiers also use a DFB type laser element incorporating a diffraction grating. However, the driving current applied to the semiconductor laser device for producing a laser beam as signal light is a small value (e.g., about 80 mA) as compared to the DFB laser element incorporating a diffraction grating used as a light source for exciting a Raman amplifier (e.g., the driving current increases about 1000 mA and a high output laser beam of over 300 mW is emitted). Along with the increase in the driving current of such Raman amplifier light sources, the temperature of an active layer of the laser device increases and the oscillation wavelength tends to shift to the longer wavelength side. Additionally, the semiconductor laser devices used as a light source for exciting a Raman amplifier require a wavelength control at a precision of about ±0.5 nm. The above factors render the use of conventional semiconductor laser devices used as a light source for exciting a Raman amplifier.

Generally, in the light source for exciting a Raman amplifier, a flat amplification characteristic is obtained by controlling the oscillation wavelength at a specific wavelength interval between plural semiconductor laser devices, but the amplification factor varies depending on whether the light input of the object of control is small or large, and hence it has been attempted to increase or decrease the light output of the Raman amplifier exciting light source depending on the magnitude of the light input. In other words, the driving current of the Raman amplifier exciting light source is increased or decreased in order to control the oscillation wavelength and thereby produce a flat amplification characteristic. As a result, as mentioned above, the temperature of the active layer changes and the oscillation wavelength shifts, and a flat amplification characteristic cannot be obtained.

SUMMARY OF THE INVENTION

The present invention provides a semiconductor laser device and a drive control method for a semiconductor laser device capable of obtaining a stable oscillation wavelength, in a simple, small and inexpensive structure, without requiring waveform monitor, regardless of a significant increase or decrease in driving current.

The present invention advantageously provides a semiconductor laser device including a semiconductor laser element, a temperature measuring element configured to measure a temperature, and a temperature regulating unit having the semiconductor laser element and the temperature measuring element thermally connected thereto. The semiconductor laser device also includes a current detecting unit configured to detect a driving current applied to the semiconductor laser element. Further, the semiconductor laser device includes a control unit configured to control the temperature regulating unit using a control function to achieve a substantially constant wavelength output from the semiconductor laser element. The control function defines a relationship between a predetermined driving current and a predetermined temperature. The control unit is configured to control the temperature regulating unit such that the temperature detected by the temperature measuring element substantially equals the predetermined temperature corresponding to the detected driving current as defined by the control function.

Additionally, the present invention advantageously provides a semiconductor laser device including a semiconductor laser element, a temperature measuring element configured to measure a temperature, and a temperature regulating unit having the semiconductor element and the temperature measuring element thermally connected thereto. The semiconductor laser device also includes a means for detecting a driving current applied to the semiconductor laser element. The semiconductor laser device further includes a means for controlling the temperature regulating unit using a control function to achieve a substantially constant wavelength output from the semiconductor laser element.

The present invention further advantageously provides a drive control method for a semiconductor laser device. The method includes the step of determining a control function defined as a relationship between a predetermined driving current and a predetermined temperature to achieve a substantially constant wavelength output from a semiconductor laser element of the semiconductor laser device. The method further includes a step of detecting a driving current applied to the semiconductor laser element. Further, the method includes controlling a temperature regulating unit such that a temperature detected by a temperature measuring element substantially equals the predetermined temperature corresponding to the detected driving current as defined by the control function. In this method, the semiconductor laser element and the temperature measuring element are thermally connected to the temperature regulating unit.

Additionally, the present invention advantageously provides a drive control method for a semiconductor laser device for controlling a temperature of a semiconductor laser element on a basis of a temperature detected by a temperature measuring element disposed near the semiconductor laser element thereby controlling a wavelength of a laser beam oscillated by the semiconductor laser element. The method includes the steps of detecting a driving current applied to the semiconductor laser element, and acquiring a relationship between driving current and temperature at which the wavelength of the laser beam oscillated by the semiconductor laser element is generally constant. The method further includes the step of controlling the temperature of the semiconductor laser element so that the detected temperature of the semiconductor laser element and the corresponding detected driving current satisfy the acquired relationship.

Furthermore, the present invention advantageously provides a drive control method for a semiconductor laser device for controlling a temperature of a semiconductor laser element on a basis of a temperature detected by a temperature measuring element disposed near the semiconductor laser element thereby controlling a wavelength of a laser beam oscillated by the semiconductor laser element. The method includes the steps of detecting a driving current applied to the semiconductor laser element, and acquiring a plurality of relationships between driving current and temperature in which the wavelength of the laser beam oscillated by the semiconductor laser element is generally constant. The method also includes the steps of setting a desired wavelength, and changing from a present relationship to a new relationship corresponding to the desired wavelength. Further, the method includes a step of controlling a temperature of the semiconductor laser element so that the detected temperature and the corresponding detected driving current satisfy the new relationship.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DESCRIPTION OF THE PREFERRED EMBODIMENTS

Embodiments of the semiconductor laser device and drive control method for a semiconductor laser device according to the present invention will be explained in detail below.

Figure 1:
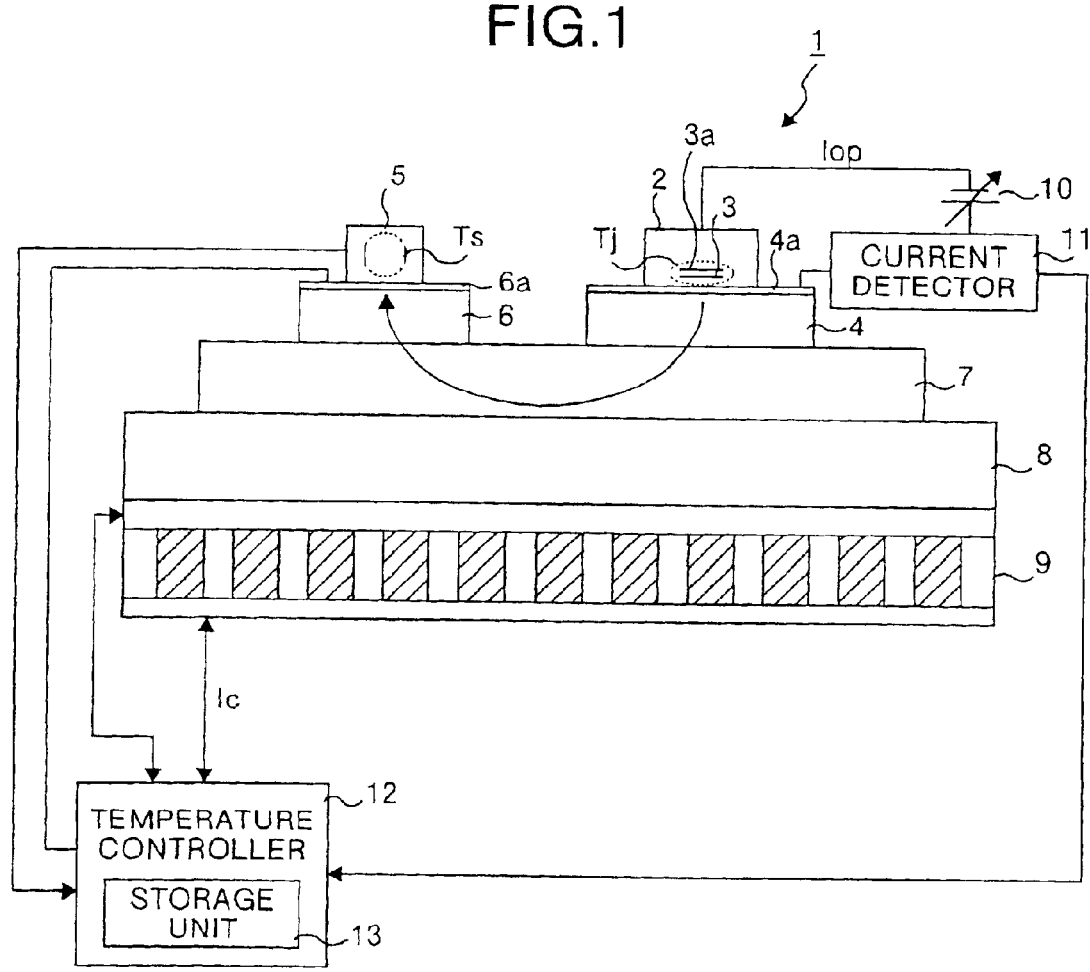
FIG. 1 is a diagram showing a first embodiment of a semiconductor laser device according to the present invention.

FIG. 1 is a diagram showing a first embodiment of a semiconductor laser device according to the present invention. As depicted in FIG. 1, the semiconductor laser device 1 has a semiconductor laser element 2 disposed on a thin metal film 4a that is provided on an upper surface of a sub-mount 4. When a driving current Iop is applied to the semiconductor laser element 2, the semiconductor laser element 2 oscillates and produces a laser beam of desired wavelength from an active layer 3. The semiconductor laser element 2 has a diffraction grating 3a provided near the active layer 3. The diffraction grating 3a is constructed to select a desired wavelength from the laser beam produced by the active layer 3.

The driving current Iop is supplied to a variable power source 10, and is detected by a current detector 11. The driving current Iop detected by the current detector 11 is sent into a temperature controller 12.

The semiconductor laser device 1 includes a temperature measuring element 5 such as, for example, a thermistor or the like. The temperature measuring element 5 is disposed on a thin metal film 6a that is provided on an upper surface of a sub-mount 6. The temperature measuring element 5 is disposed near the semiconductor laser element 2. The temperature measuring element 5 is connected to the temperature controller 12, and the temperature controller 12 acquires temperature Ts measured by the temperature measuring element 5.

The sub-mount 4 is made of heat conducting and electrically insulating material such as, for example, AlN or diamond. The sub-mount 6 is made of heat conducting and electrically insulating material such as, for example, AlN. The sub-mounts 4, 6 are disposed on a carrier 7 that is made of a heat and electrically conducting material such as, for example, CuW. The carrier 7 is disposed on a base 8 that is made of a heat and electrically conducting material. The semiconductor laser device 1 includes a temperature regulating unit such as, for example a Peltier device 9, that is disposed beneath the base 8. The base 8 is preferably made of a material (for example, CuW) having the small difference of a thermal expansion coefficient between a thermal expansion coefficient of the base 8 and a thermal expansion coefficient of an upper layer of the Peltier device 9 upon which the base is mounted, whereby the base 8 acts as a buffer. The carrier 7 acts as the support of the semiconductor laser 2. And the base 8 acts as the support of the parts such as, for example, a photo detector or a lens in a module.

The temperature controller 12 includes a storage device or storage unit 13 for storing a control function described below. The driving current Iop detected by the current detector 11 is entered in the control function. Based upon the temperature indicated by the control function as corresponding to the detected driving current Iop, the current direction and current amount of the current Ic to the Peltier device 9 is controlled by the temperature controller 12 so that the temperature Ts detected by the temperature measuring element 5 is generally equal to the temperature indicated by the control function. That is, the temperature controller 12 controls the current feeding direction and feeding amount into the Peltier device 9 thereby controlling a cooling/heating operation of the Peltier device 9, and the temperature is controlled so that the detected temperature of the temperature measuring element 5 may be a value corresponding to the control function.

Figure 2:
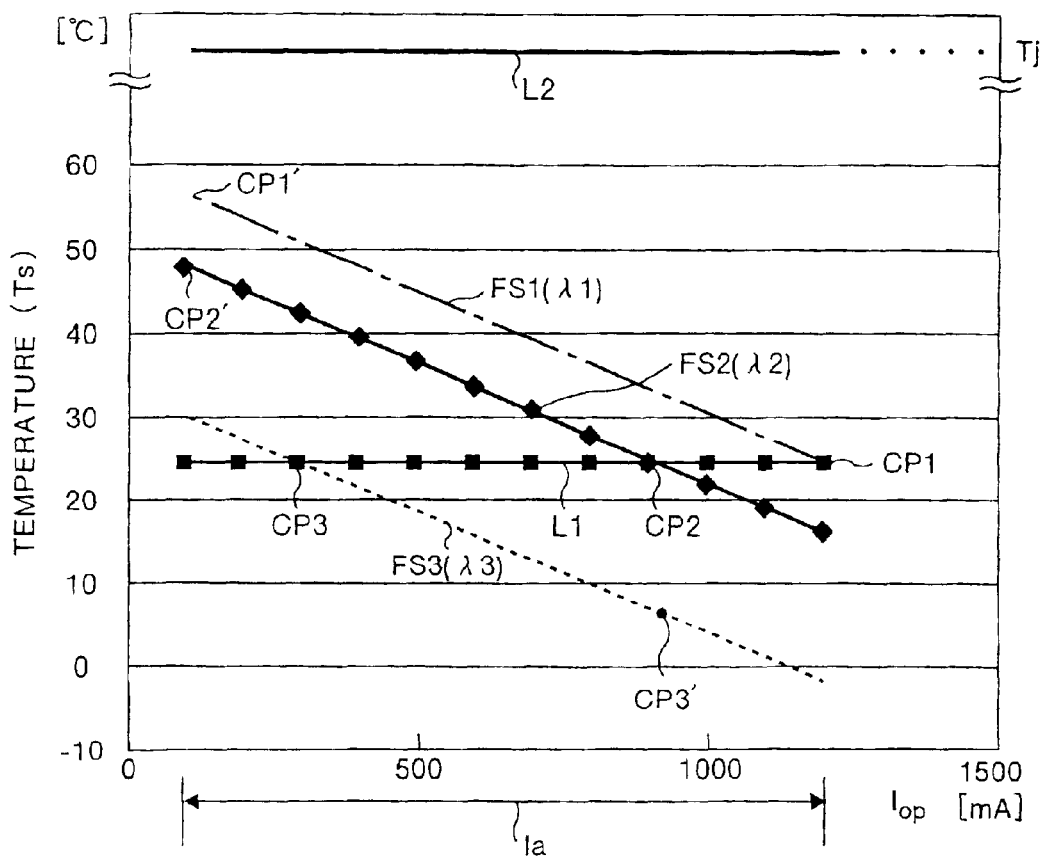
FIG. 2 is a graph showing examples of control function stored in a storage unit of a temperature controller shown in FIG. 1.

The control function is explained in detail below. FIG. 2 is a graph showing examples of control functions FS1, FS2, and FS3 stored in the storage unit 13 of the temperature controller 12. In FIG. 2, line L1 refers to a case where the temperature Ts detected by the temperature measuring element 5 is controlled to be constant (e.g. at 25° C.) regardless of any increase or decrease in the driving current Iop. By contrast, the first embodiment of the present invention includes control functions FS1, FS2, and FS3 in which the temperature Ts varies along a downwardly sloping line as the driving current Iop decreases. Note that the temperature Ts of the temperature measuring element 5 is controlled such that the temperature Tj of the active layer 3 (see line L2) remains constant regardless of the driving current Iop, as is reflected by the fact that a constant oscillating wavelength is maintained. The control functions FS1, FS2, and FS3 are used to control the Peltier device 9 so that when the detected value of the driving current Iop is entered into the control function (for example, FS2), the temperature corresponding to the detected driving current Iop as defined in the control function is generally equivalent to the temperature Ts detected by the temperature measuring element 5.

In order to ensure that the temperature Ts detected by the temperature measuring element 5 is equal to the temperature defined by the control function, the temperature controller 12 changes the current direction and current amount of the current Ic in the Peltier device 9, thereby controlling the temperature Ts in a manner so as to maintain the temperature Tj of the active layer 3 at a constant level. Similarly, when the control function FS1 or FS3 is being used, the temperature Ts is controlled so as to maintain the relation of the control function FS1 or FS3, respectively.

The control functions FS1, FS2, and FS3 are defined in a driving range Ia of the driving current Iop and are defined so as to provide a generally constant wavelength. It should be noted that the downward slope of the various control functions as the driving current Iop is increased is a result of the increased cooling being performed by the Peltier device 9 at higher driving currents needed to maintain the temperature Tj of the active layer 3 at a constant level Iop, as is reflected by the fact that a constant oscillating wavelength is maintained. As the driving current Iop is increased, the amount of heat produced by the semiconductor laser element 2 will also increase, and accordingly, the Peltier device 9 will need to pump a larger amount of heat away from the semiconductor laser element 2 to maintain a constant temperature Tj at the active layer 3 and a constant output wavelength. Since the semiconductor laser element 2 and the temperature measuring element 5 are mounted on separate sub-mounts that are each thermally connected to the Peltier device 9, the Peltier device 9 will also remove heat from the temperature measuring element, thereby resulting in a decrease in temperature Ts shown in the downward slope of the various control functions with increasing driving current Iop.

The control function FS1 is defined to provide a constant oscillating wavelength of $\lambda 1=1500.1$ nm. The control function FS1 was determined by measuring a temperature Ts of 25° C. when the driving current Iop is 1200 mA, and then measuring a temperature Ts of 56° C. when the driving current Iop is 100 mA. The control function FS1 is then determined by drawing a straight line linking coordinate CP1 (at a temperature of 25° C. and a driving current Iop of 1200 mA) and coordinate CP1' (at a temperature of 56° C. and a driving current Iop of 100 mA).

The control function FS2 is defined to provide a constant oscillating wavelength of $\lambda 2=1499$ nm. The control function FS2 was determined by measuring a temperature Ts1 of 25° C. when the driving current Iop is 900 mA, and then measuring a temperature Ts2 of 48° C. when the driving current Iop is 100 mA. The control function FS2 is then determined by drawing a straight line linking coordinate CP2 (at a temperature Ts1 of 25° C. and a driving current Iop of 900 mA) and coordinate CP2' (at a temperature Ts2 of 48° C. and a driving current Iop of 100 mA).

Furthermore, the control function FS3 is defined to provide a constant oscillating wavelength of $\lambda 3=1497.7$ nm. The control function FS3 was determined by measuring a temperature of 25° C. when the driving current Iop is 300 mA, and then measuring a temperature of 7° C. when the driving current Iop is 900 mA. The control function FS3 is then determined by drawing a straight line linking coordinate CP3 (at a temperature of 25° C. and a driving current Iop of 300 mA) and coordinate CP3' (at a temperature of 78° C. and a driving current Iop of 900 mA).

The control functions are determined by observing the temperature Ts at which a given driving current produces a constant wavelength output from the semiconductor laser device 1. While the actual temperature Tj of the active layer 3 cannot be precisely measured, it is safe to assume that the temperature Tj remains constant if the output wavelength of the semiconductor laser element 2 remains constant. Accordingly, the output wavelength is observed in order to determine the proper temperature Ts at the temperature measuring element 5 that will produce a constant output wavelength. While the actual temperature Tj of the active layer 3 is not measured, by instead measuring the output wavelength of the laser beam, a result of an equivalent accuracy is achieved by the first embodiment of the present invention.

Note that the control functions of a given structural configuration of a semiconductor laser device may differ from control functions FS1, FS2, and FS3 of the first embodiment discussed herein. If the structural configuration of the semiconductor laser device (for example, the materials used to construct the device, the locations of various features, or the addition or subtraction of various features) is modified, then the control function required to maintain a constant temperature Tj at the active layer may differ from those described herein. For any given structural configuration of semiconductor laser device, the control functions applicable to that device can be obtained using the method described above with respect to the control functions FS1, FS2, and FS3.

One or more of the control functions FS1, FS2, and FS3 is stored in the storage unit 13. The temperature controller 12 accesses the control functions within the storage unit 13 in order to drive and control the Peltier device 9 so that the detected temperature Ts may satisfy the control function stored in the storage unit 13 on the basis of the driving current Iop detected by the current detector 11 and the temperature Ts detected by the temperature measuring unit 5. For example, by controlling the temperature Ts using the control function FS2, the oscillation wavelength is constant at wavelength $\lambda 2$. Therefore, the oscillation wavelength does not jump due to shifting of the oscillation wavelength, whereby a dynamic stability of oscillation wavelength is obtained. Similarly, the wavelength can be controlled at constant oscillation wavelengths $\lambda 1, \lambda 3$ by controlling the temperature on the basis of the control functions FS1 and FS3.

Figure 3:
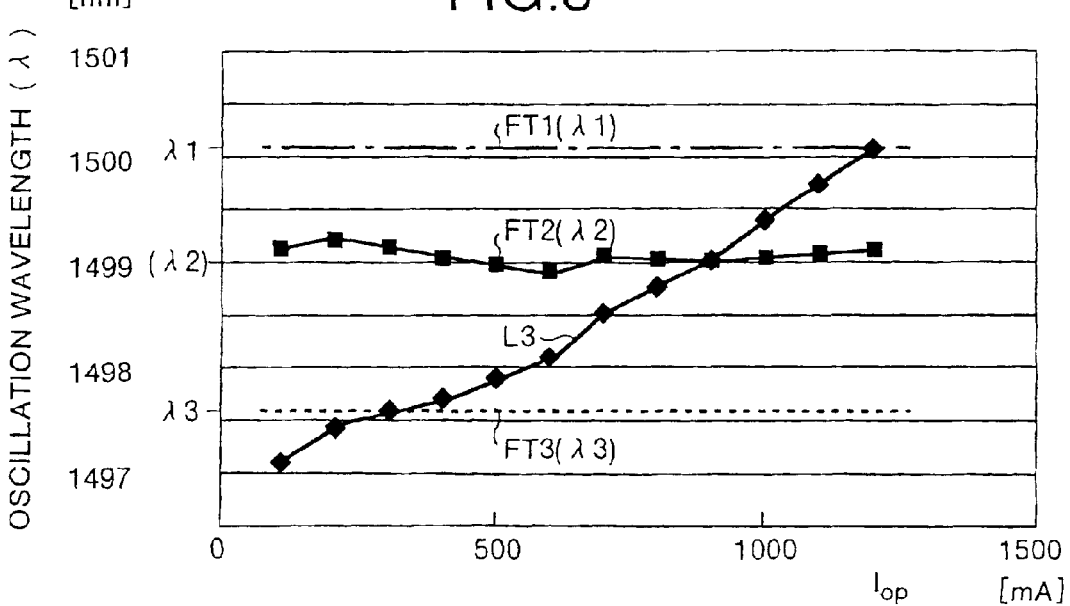
FIG. 3 is a graph showing driving current dependence of oscillation waveform in the semiconductor laser device shown in FIG. 1.

FIG. 3 is a graph showing a wavelength control result on the basis of control functions FS1, FS2, and FS3. In FIG. 3, line L3 shows changes of oscillation wavelength $\lambda$ in the case where the temperature Ts detected by the temperature measuring element 5 is controlled to be constant regardless of any increase or decrease in the driving current Iop, as was the case for line L1 in FIG. 2 (e.g., in a pumping laser without temperature control). For line L3, as the driving current Iop increases from 100 mA to 1200 mA, the wavelength $\lambda$ is shifted to the longer wavelength side by about 3 nm, from about 1497 nm to about 1500 nm. By contrast, in the present invention using a temperature control according to control functions FS1, FS2, and FS3, if the driving current Iop is increased from 100 mA to 1200 mA, then constant oscillation wavelengths λ1, λ2, and λ3, respectively, are maintained as represented by wavelength characteristic curves FT1, FT2, and FT3, respectively. For example, in the case where temperature control is performed on the basis of the control function FS2, a precision of λ2±0.5 nm is maintained, thereby producing a laser beam having a stable wavelength. (The black square marks and black diamond marks shown in FIG. 2 and FIG. 3 are measured values.)

While the measurement of the wavelength output from the semiconductor laser device was needed to initially define the control functions for the structural configuration described herein, the wavelength of the final products need not monitored during operation of the semiconductor laser devices. Since the wavelength is not monitored, an optical system is not needed for the semiconductor laser device, and inexpensive semiconductor laser device can be realized. Accordingly, the structure of the semiconductor laser device of the present invention is simple and small.

Figure 4:
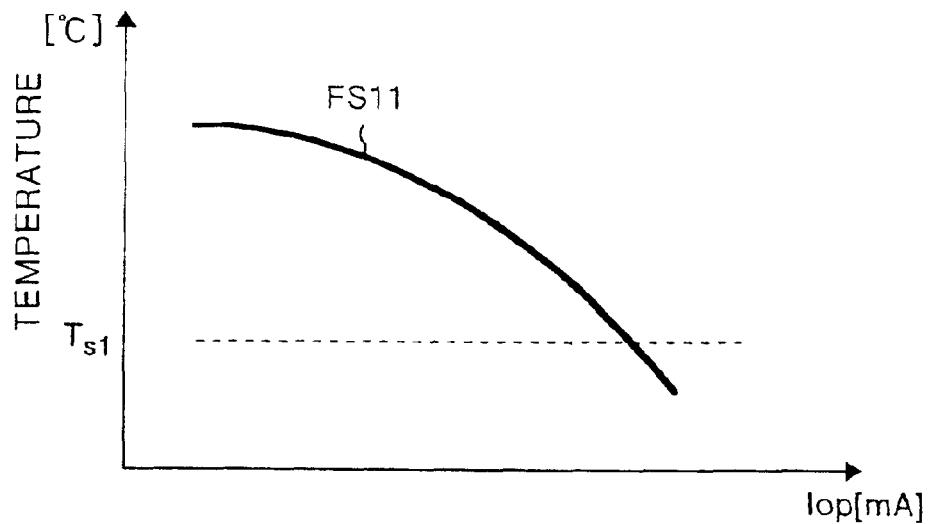
FIG. 4 is a graph showing an example of quadratic function as a control function to be stored in the storage unit of the temperature controller shown in FIG. 1.

While the control functions FS1, FS2, and FS3 shown in FIG. 2 are linear functions, alternatively a quadratic control function FS11 shown in FIG. 4 can be used if desired. Generally, the temperature rise of the active layer 3 due to an increase in the driving current Iop is divided into a power consumed by laser oscillation, and a power consumed by resistance of the active layer 3, the power consumed by resistance of the active layer 3 is the product of this resistance multiplied by the square of the driving current Iop, and hence the temperature change of the active layer 3 relating to the driving current Iop is considered to change in a square. That is, supposing the built-in voltage of the active layer 3 to be Vo and the series resistance of the laser element of the active layer 3 to be R, when the driving current Iop of driving voltage is applied to the semiconductor laser device, the total power W is expressed as follows:

$$W = Iop \cdot V$$

$$W = (Vo + R \cdot Iop) \cdot Iop$$

$$W = Vo Iop + Iop^2 R$$

Since 80 to 90% of this total power W is changed to Joule heat, the temperature change of the active layer 3 is a quadratic function of the driving current Iop. Therefore, by using the control function FS11 of quadratic function, the oscillation wavelength may be further stabilized.

Figure 5:
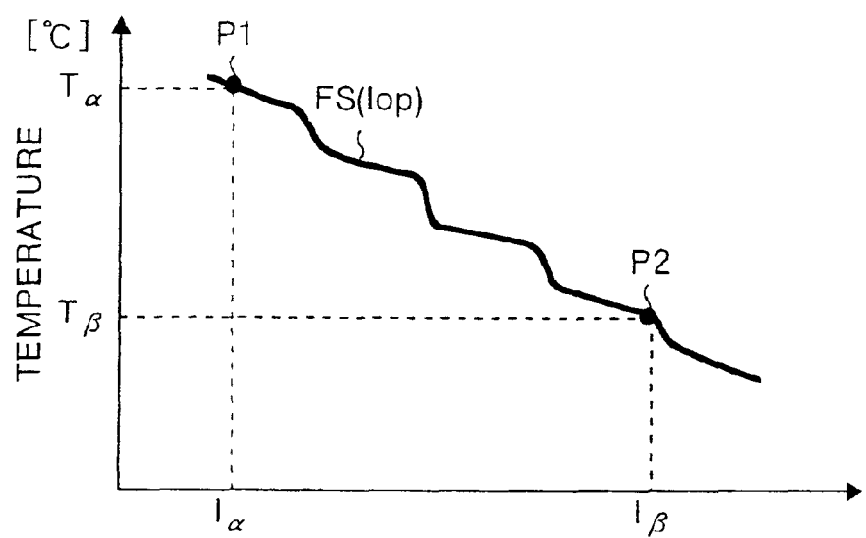
FIG. 5 is a graph showing another example of a control function stored in the storage unit of the temperature controller shown in FIG. 1.

Furthermore, as shown in FIG. 5, the control function can be an arbitrary control function, such as the control function FS (Iop). Generally, since the characteristic curve of laser oscillation efficiency varies significantly depending on the structure or operation of the semiconductor laser device 1, the control function FS (Iop) can be defined corresponding to a specific type of semiconductor laser device. In this case, the control function FS (Iop) of the semiconductor laser device can be determined by measuring point P1 at the driving current Ia and at the detected temperature Tα of the temperature measuring element. Additional points can be added to increase the accuracy of the control function FS (Iop), such as point P2. Using this process, a control function of higher precision is obtained.

Additionally, it is noted that in an alternative embodiment the temperature control function FS1, FS2, and FS3 shown in FIG. 2 can be corrected using the wavelength deviations shown in the wavelength characteristic curves FT1, FT2, and FT3, respectively, shown in FIG. 3. In other words, the control functions FS1, FS2, and FS3 can be modified to produce wavelength characteristic curves FT1, FT2, and FT3, respectively, that are flat (i.e. provide a constant and precise output wavelength regardless of the driving current Iop).

Figure 6:
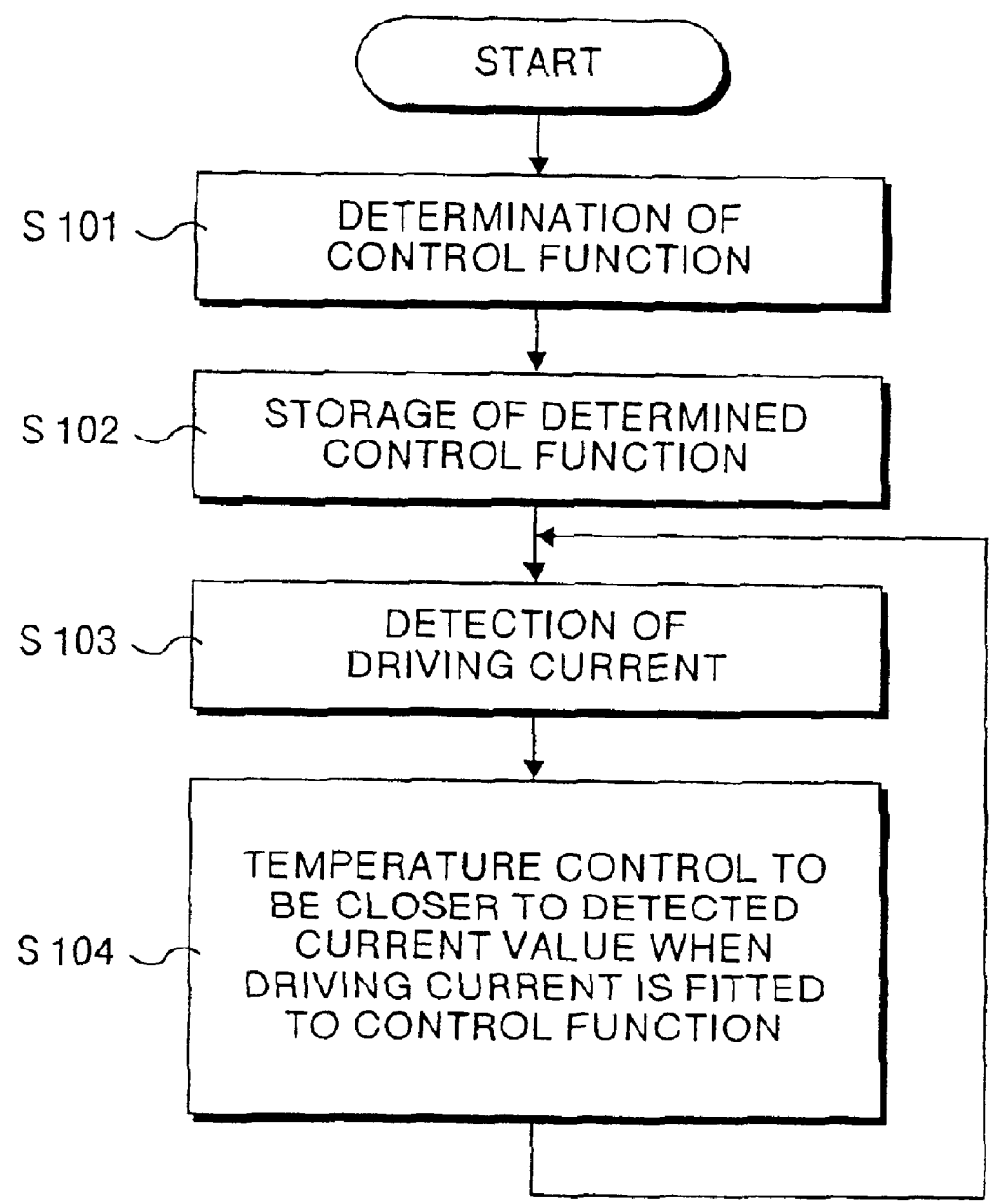
FIG. 6 is a flowchart showing a drive control method for a semiconductor laser device shown in FIG. 1.

Referring to the flowchart in FIG. 6, a drive control method for a semiconductor laser device of the first embodiment of the invention is explained below.

The drive control method begins with a step S101 in which the control function is determined. For example, step S101 is performed by applying a driving current Iα within a driving range Ia to the semiconductor laser device 1. Then, the temperature Tα of the temperature detecting element 5 is detected to determine point P1. Then, a driving current Iβ is applied to the semiconductor laser device 1, and a temperature Tβ of the temperature detecting element 5 is detected to determine point P2. And then, a straight line is linking the two points P1 and P2 is determined, thereby providing the control function. When acquiring the points P1 and P2, the Peltier device 9 is controlled so that the oscillation wavelength remains constant. Once the control function is determined, the method proceeds with a step S102 of storing the control function in the storage unit 13.

Steps S101 and S102 are performed during the manufacturing stages of the semiconductor laser device 1. The control function determined for a specific structural configuration of a semiconductor laser device should be sufficiently accurate for use with all semiconductor laser devices manufactured with the same structural configuration. Therefore, it is generally not necessary to perform this calibration technique for each individual semiconductor laser device manufactured. However, in order to ensure the highest degree of accuracy for the semiconductor laser devices, it is desirable to calibrate each individual laser device, and it may also be desirable to recalibrate the laser device after prolonged usage.

Once the semiconductor laser device 1 is utilized in an operational setting, the method includes a step S103 of detecting the driving current Iop input to the semiconductor laser device 1. For example, the temperature controller 12 detects the driving current Iop detected by the current detector 11.

Once the driving current Iop is detected, the method includes a step S104 of controlling the temperature of the system based upon the control function. For example, the detected driving current Iop is compared by the temperature controller 12 to the control function stored in the storage unit 13. The temperature controller 12 determines (based upon the detected driving current Iop and the control function) the theoretical temperature at which the temperature measuring element 5 should be at in order to produce the desired output wavelength. Accordingly, the temperature controller 12 controls the Peltier device 9 such that the detected temperature Ts of the temperature measuring element 5 equals the theoretical temperature derived from the control function. Steps S103 and S104 are repeated during the operation of the semiconductor laser device 1 in order to ensure that the oscillation wavelength output from the laser device 1 remains constant, even if the driving current Iop is changed.

It is noted that the semiconductor laser element 2 of the present invention shown in FIG. 1 can be used as a Raman amplifier exciting light source by oscillating a plurality of longitudinal modes by providing the diffraction grating 3a with a drift of wavelength selection. (See Japanese Patent Application No. 2000-323118.) Additionally, the present invention can be also used in other optical fiber amplifier exciting light sources such as, for example, EDFA exciting light sources and general semiconductor laser elements.

In particular, when plural semiconductor laser devices 1 are used as a Raman amplifier exciting light source, the oscillation wavelength is not changed regardless of an increase or a decrease in driving current Iop. In such Raman amplifier exciting light sources, the wavelength dependence of amplification gain by combination of semiconductor laser devices 1 maintains the flatness, so that a favorable amplification characteristic may be maintained.

In the above description of the first embodiment, one control function is stored in the storage unit 13, and the Peltier device 9 is driven and controlled to achieve a detected temperature Ts satisfying this control function. However, it is possible to store and utilize plural control functions corresponding to plural oscillation wavelengths, whereby the wavelength of the laser beam is controlled in a precise and effective manner. One such embodiment is described below as a second embodiment of the present invention.

Figure 7:
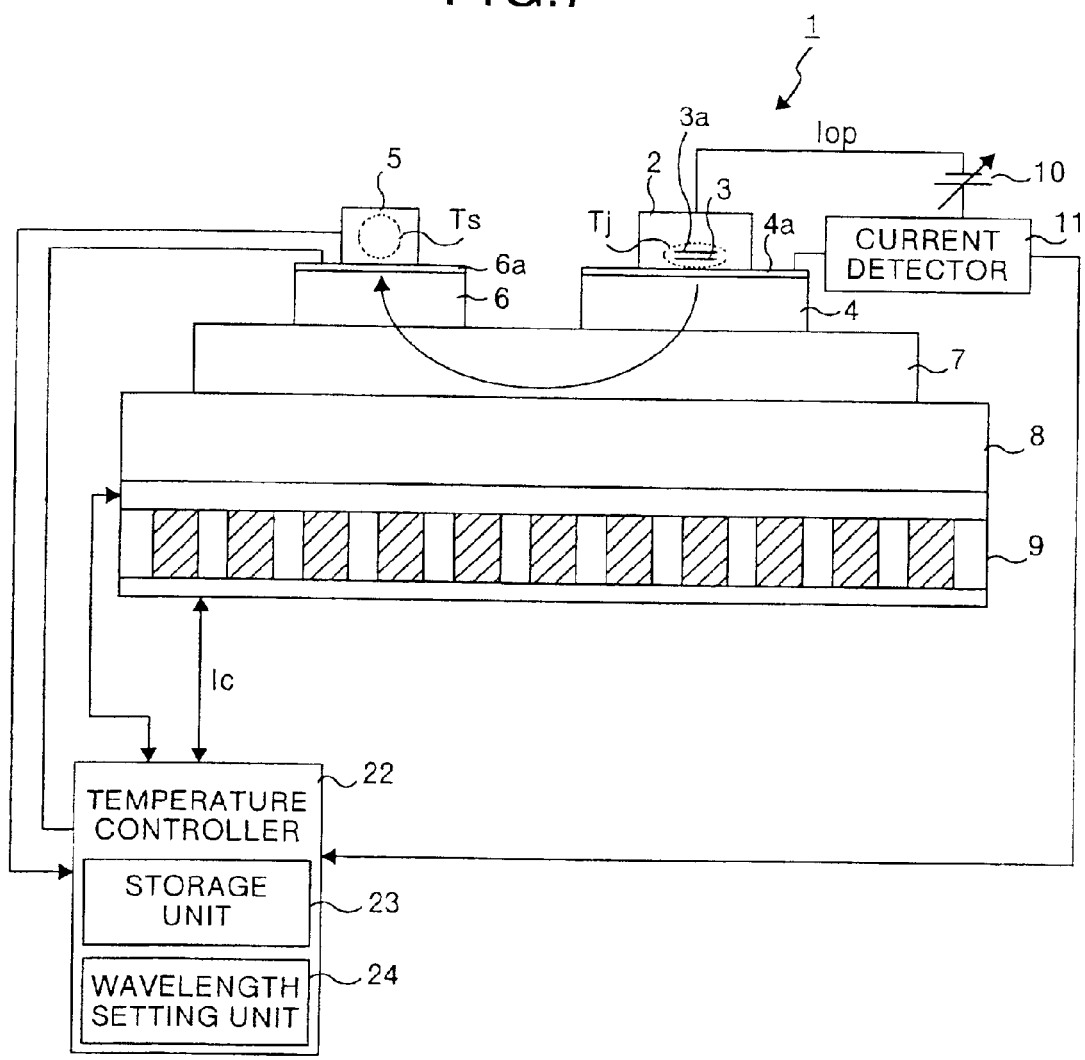
FIG. 7 is a diagram showing a second embodiment of a semiconductor laser device according to the present invention.

FIG. 7 is a diagram showing a second embodiment of a semiconductor laser device according to the present invention. In FIG. 7, a temperature controller 22 corresponds to the temperature controller 12 of the first embodiment, and includes a storage unit 23 and a wavelength setting unit 24. The storage unit 23 generally corresponds to the storage unit 13 of the first embodiment, but is different from the storage unit 13 in that the storage unit 23 holds plural control functions, such as a control function group FSS. In the second embodiment, a desired wavelength to be controlled is set and entered in the wavelength setting unit 24.

Figure 8:
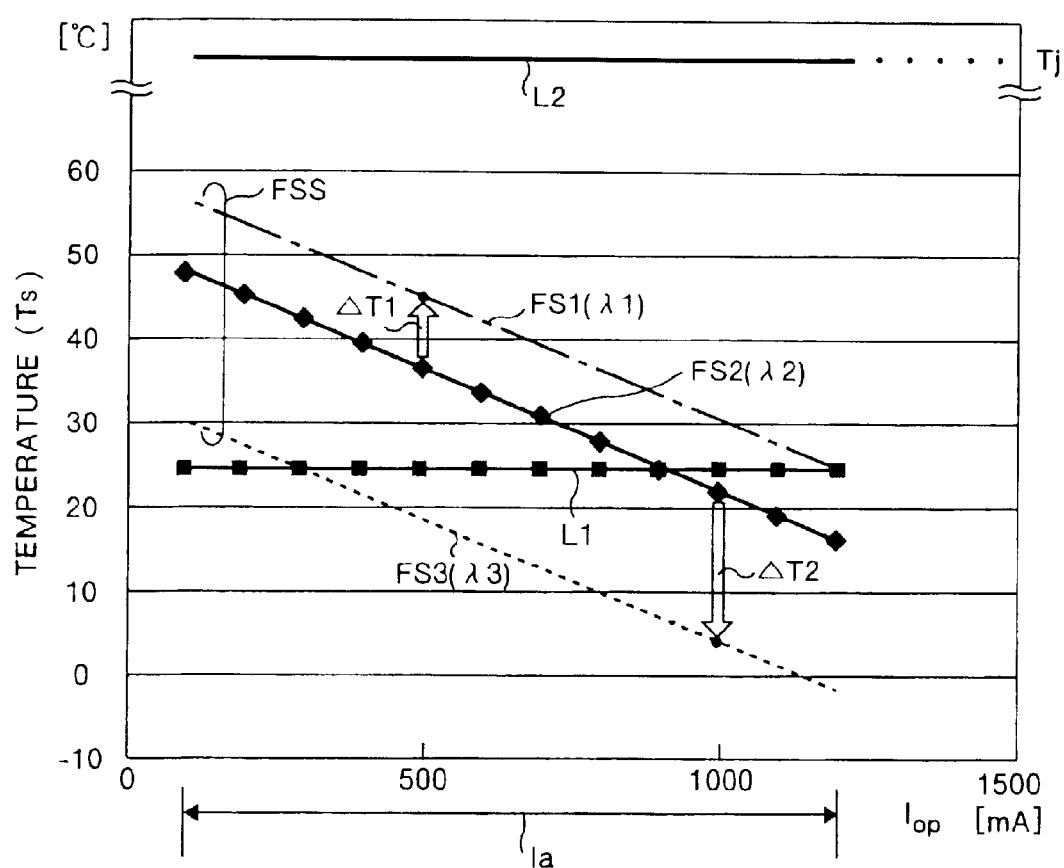
FIG. 8 is a graph showing examples of a control function group stored in a storage unit of a temperature controller shown in FIG. 7.

The temperature controller 22 accesses a control function from the storage unit 23 corresponding to the wavelength set by the wavelength setting unit 24, and changes the control function of the object of control to this control function. The temperature controller 22 then controls the temperature to satisfy this changed control function. In FIG. 8, for example, assuming the present control function is control function FS2, if the wavelength set by the wavelength setting unit 24 is λ1, the temperature controller 22 changes from the present control function FS2 to control function FS1, and controls the temperature according to the control function FS1 thereafter. As a result, since the driving current Iop remains constant (e.g. at 500 mA in FIG. 8), and since the temperature is controlled so that the detected temperature Ts is shifted higher by a temperature change of ΔT1 (e.g., 10° C.), then the output wavelength of the laser beam shifts from a wavelength of λ2 to a wavelength of λ1. Similarly, when the wavelength is set by the wavelength setting unit 24 as wavelength λ3, the temperature controller 22 changes from the present control function FS2 to control function FS3. As a result, since the driving current Iop remains constant (e.g., at 1000 mA in FIG. 8), and since the temperature is controlled so that the detected temperature Ts is shifted lower by a temperature change of ΔT2 (e.g., 18° C.), then the output wavelength of the laser beam shifts from a wavelength of λ2 to a wavelength of λ3. If the driving current Iop is changed, then the temperature is controlled according to the control function presently in use.

Figure 9:
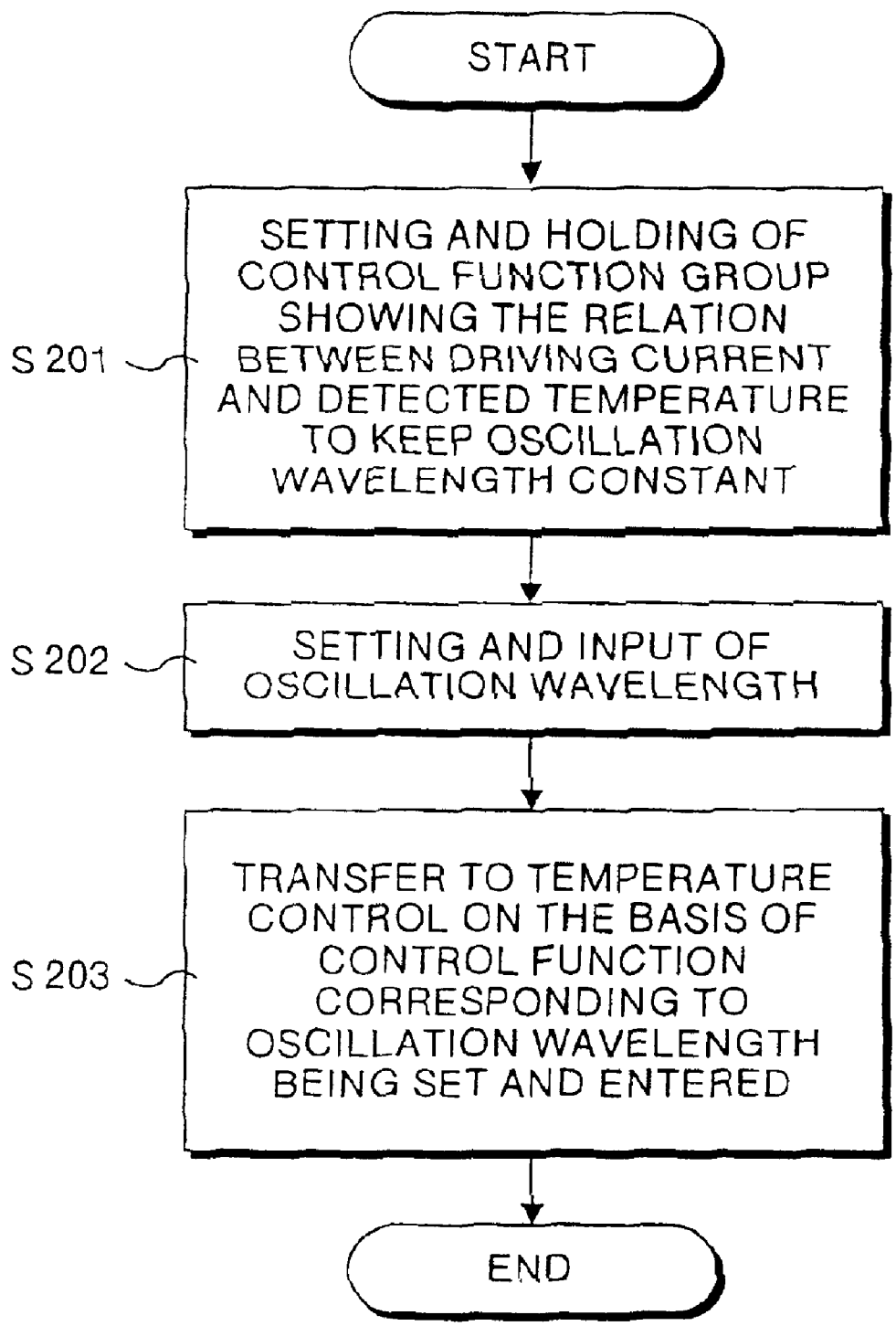
FIG. 9 is a flowchart showing a drive control method for a semiconductor laser device shown in FIG. 7.

The temperature control processing by the temperature controller 22 of the second embodiment will be explained below with reference to the flowchart shown in FIG. 9. The process begins with a step S201 that includes the setting and storing (or holding) of the control function group FSS in the storage unit 23. Then the desired oscillation wavelength A is set and the wavelength is input to the temperature controller 22 in a step S202. Then, in step S203, the temperature controller 22 shifts the temperature control to the control function corresponding to the oscillation waveform set and input in step S202, and this process is terminated.

Figure 10A:
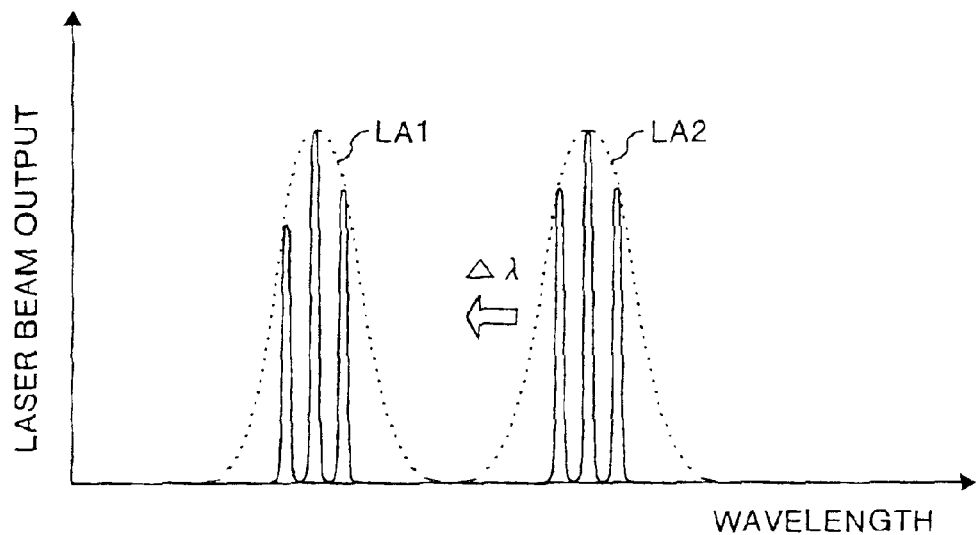
FIGS. 10A and 10B are graphs showing a correction method of gain characteristic by wavelength control in the semiconductor laser device shown in FIG. 7 used as an exciting light source for a Raman amplifier.
Figure 10B:
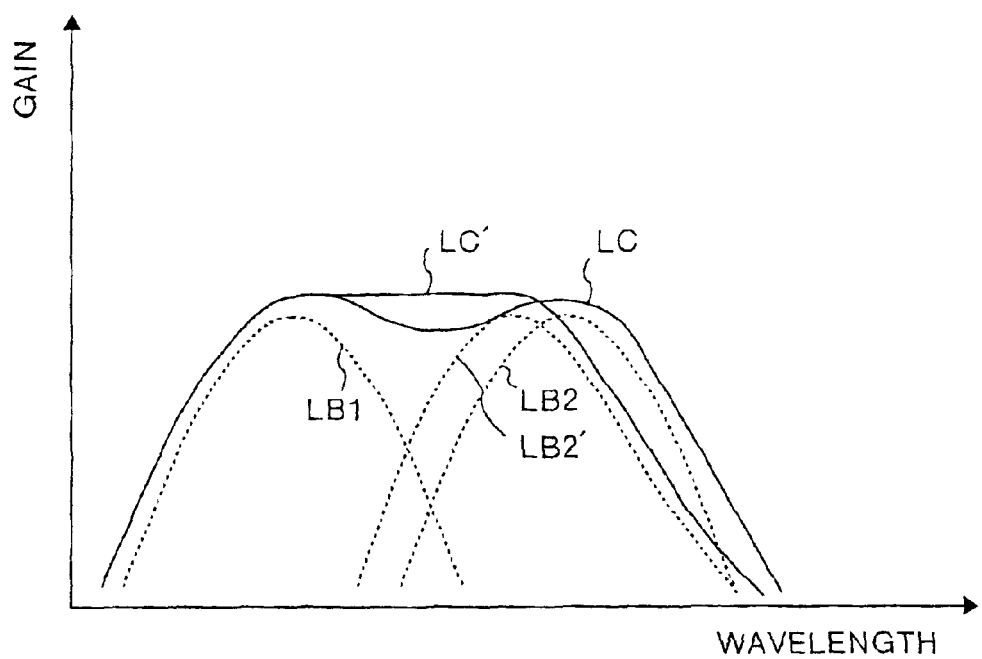

The fine wavelength control in the second embodiment can be applied to an exciting light source used, for example, in a Raman amplifier. FIG. 10A provides graphs relating to a Raman amplifier of the semiconductor laser device according to the present invention. FIG. 10A depicts a plurality of longitudinal oscillation modes in each of the oscillation wavelength spectra LA1, LA2 of each exciting light source. FIG. 10B depicts the gain characteristic of the Raman amplifier that appears at the wavelength side of about 100 nm longer, which appears as gain characteristics LB1, LB2 corresponding to the exciting light sources. Therefore, as shown in FIG. 10B, the combined gain characteristic of the gain characteristics LB1, LB2 is expressed by characteristic LC. However, since the gain characteristic is required to be flat over the wavelength band of the entered lights to be amplified, the gain characteristic LC must be further flattened.

In such a case, the fine wavelength control described above can be utilized to flatten the gain characteristic LC. For example, when the oscillation wavelength spectrum LA2 is shifted to the shorter wavelength side, the corresponding gain characteristic is shifted to the shorter wavelength side, so that the recessed portion of the characteristic LC can be flattened and the gain characteristic LC' is achieved.

In the first and second embodiments, both the semiconductor laser element 2 and temperature measuring element 5 are disposed on the sub-mounts 4, 6 provided on the carrier 7. However, the present invention is not limited to this structural configuration. Alternatively, the sub-mounts 4, 6 can be omitted such that the semiconductor laser element 2 and temperature measuring element 5 are disposed directly on the carrier 7. Alternatively, the sub-mounts 4, 6 can be integrated into a single sub-mount such that the semiconductor laser element 2 and temperature measuring element 5 are both disposed on the integrated sub-mount assembly. In these configurations, the heat conductivity between the temperature measuring element 5 and semiconductor laser 2 is enhanced, so that the temperature measuring element 5 may measure the temperature of the semiconductor laser element 2 quickly and accurately, thereby increasing the accuracy of the temperature control and wavelength control.

The present invention provides an advantageous semiconductor laser device in which a temperature control unit maintains a relationship between a driving current and a temperature detected by a temperature measuring element such that the wavelength of the laser beam oscillated by the semiconductor laser element remains generally constant. The temperature control unit controls a temperature regulating unit so that the detected temperature of the temperature measuring element corresponding to the value of the detected driving current satisfies this relationship. Therefore, the wavelength of the laser beam remains constant regardless of an increase or a decrease of the driving current. Accordingly, the driving current dependence of the oscillation wavelength issued from the semiconductor laser element can be eliminated, and a laser beam having a stable wavelength can be obtained in a simple, small and inexpensive structure.

Additionally, the present invention advantageously provides a temperature control unit that is utilized to maintain the relationship by controlling a temperature regulating unit so as to lower a detected temperature of a temperature measuring element along with an increase in the driving current detected by the current detecting unit. Therefore, the present invention eliminates the need for monitoring the wavelength of the laser beam, thereby providing a laser beam of stable wavelength in a simple, small and inexpensive structure.

Furthermore, the semiconductor laser element of the present invention advantageously incorporates a diffraction grating and oscillates plural longitudinal modes, and therefore it can be used as a Raman amplifier exciting light source capable of presenting highly precise and stable gain characteristic.

Furthermore, the present invention advantageously includes a storage unit of a temperature control unit that holds the relationship discussed above. The temperature is controlled on the basis of this relationship so as to eliminate the dependence on the driving current of the oscillation wavelength in each semiconductor laser device. Therefore, precise temperature control corresponding to an individual semiconductor laser device can be realized.

Furthermore, the temperature control unit can be configured to shift from one relationship to another relationship corresponding to a desired wavelength entered and set by the setting unit. The temperature control unit can then shift to the desired wavelength by controlling the temperature regulating unit on the basis of the shifted relationship. Therefore, the present invention can provide fine wavelength and, when used as the Raman amplifier exciting light source, correction of gain characteristic such as flattening of gain characteristic can be performed by wavelength shifting.

Furthermore, the relationship is a control function common to plural semiconductor laser devices having similar structural configuration and operation, and is determined as a specific control function for a particular semiconductor laser device by setting of detected temperature corresponding to one or more driving currents. Therefore, the control functions corresponding to the individual semiconductor laser devices can be obtained easily and precisely, so that the driving current dependence of the oscillation wavelength can be eliminated.

Furthermore, in an embodiment of the present invention the control function is a linear function of the detected temperature and the driving current so as to realize an easy temperature control. Therefore, the driving current dependence of the oscillation wavelength can be eliminated by a simple control.

Furthermore, in an embodiment of the present invention the control function is a quadratic function of the detected temperature and the driving current, corresponding to the power consumption in the active layer. Therefore, the driving current dependence of the oscillation wavelength can be eliminated effectively by a simple control.

According to the drive control method for a semiconductor laser device according to the invention, a relationship between the driving current and the temperature detected by the temperature measuring element in which the wavelength of the laser beam oscillated by the semiconductor laser element is almost constant is determined in a relationship acquiring step. Then, a change in the driving current applied to the semiconductor laser element is detected in a current detecting step. Then, the temperature of the semiconductor laser element is controlled repeatedly in a temperature controlling step so that the detected temperature of the temperature measuring element corresponding to the value of the driving current detected by the current detecting unit may satisfy the above relationship. Therefore, the driving current dependence of the oscillation wavelength issued from the semiconductor laser device can be eliminated, and a laser beam having a stable wavelength without shift of oscillation wavelength can be obtained in a simple, small and inexpensive structure.

According to a drive control method for the semiconductor laser device of an embodiment of the invention, a plurality of relations between the driving current and the temperature detected by the temperature measuring element in which the wavelength of the laser beam oscillated by the semiconductor laser element is almost constant are determined in a relationship acquiring step. Then, a step of setting and entering a desired wavelength is performed, and a step of shifting the relationship from a present relationship to a desired relationship corresponding to a desired wavelength is performed. Then, a change in the driving current applied to the semiconductor laser element is detected, and the temperature of the semiconductor laser element is controlled so that the relationship shifted at the relation shifting step and the detected temperature corresponding to the driving current satisfy the relationship. Therefore, fine wavelength control is precisely performed and, when used as a Raman amplifier exciting light source, correction of gain characteristic such as flattening of gain characteristic is performed by wavelength shifting.

It should be noted that the exemplary embodiments depicted and described herein set forth the preferred embodiments of the present invention, and are not meant to limit the scope of the claims hereto in any way.

Numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A semiconductor laser device comprising:
    a semiconductor inset element;
    a temperature measuring element to measure a temperature of said semiconductor laser element;
    a temperature regulating unit thermally connected to said semiconductor laser element and said temperature measuring element;
    a current detecting unit to detect a driving current applied to said semiconductor laser element; and
    a control unit to control said temperature regulating unit by a control function to achieve a substantially constant wavelength output from said semiconductor laser element, said control function defining a relationship between a predetermined driving current and a predetermined temperature, said control unit being electrically connected said temperature measuring element, said temperature regulating unit, and said current detecting unit to control said temperature regulating unit such that the temperature detected by said temperature measuring element substantially equals the predetermined temperature corresponding to the detected driving current as defined by said control function,
    wherein said semiconductor laser element includes a diffraction grating to oscillate plural longitudinal modes.

2. The semiconductor laser device according to claim 1, wherein said control unit is configured to control said temperature regulating unit to extract heat from said semiconductor laser element as the detected driving current increases in accordance with said control function.

3. The semiconductor laser device according to claim 1, wherein:
    said semiconductor laser element includes an active layer; and
    said control function is defined such that a temperature of said active layer remains substantially constant for varying driving currents.

4. The semiconductor laser device according to claim 1, wherein said control unit includes a storage unit configured to store said control function.

5. The semiconductor laser device according to claim 1, wherein:
said control unit further comprises a setting unit which sets a desired wavelength, and a storage unit configured to store plural control functions;
said control unit is configured to select a new control function from said plural control functions that corresponds to a desired wavelength entered into said setting unit; and
said control unit is configured to control said temperature regulating unit according to said new control function.

6. The semiconductor laser device according to claim 1, wherein said control function is common to semiconductor laser devices having similar structure and operation.

7. The semiconductor laser device according to claim 1, wherein said control function is defined by plural temperatures detected by said temperature measuring element and corresponding driving currents detected by said current detecting unit where a substantially constant wavelength output from said semiconductor laser element is maintained.

8. The semiconductor laser device according to claim 1, wherein said control function is a linear function of predetermined temperature versus predetermined driving current.

9. The semiconductor laser device according to claim 1, wherein said control function is a quadratic function of predetermined temperature versus predetermined driving current.

10. The semiconductor laser device according to claim 1, wherein said temperature regulating unit is a Peltier device and said temperature measuring device is a thermistor.

11. A semiconductor laser device comprising:
a semiconductor laser element;
a temperature measuring element to measure a temperature of said semiconductor laser element;
a temperature regulating unit thermally connected to said semiconductor element and said temperature measuring element;
a means for detecting a driving current applied to said semiconductor laser element; and
a means for controlling said temperature regulating unit using a control function to achieve a substantially constant wavelength output from said semiconductor laser element, such that the temperature detected by said temperature measuring element substantially equals the predetermined temperature corresponding to the detected driving current as defined by said control function,
wherein said means for controlling is electrically connected to said temperature measuring element said temperature regulating unit, and said means detecting, and
wherein said semiconductor laser element includes a diffraction grating to oscillate plural longitudinal modes.

12. The semiconductor laser device according to claim 11, wherein said control function defines a relationship between a predetermined driving current and a predetermined temperature; and
said means for controlling controls said temperature regulating unit such that the temperature detected by said temperature measuring element substantially equals the predetermined temperature corresponding to the detected driving current as defined by said control function.

13. The semiconductor laser device according to claim 11, wherein said means for controlling controls said temperature regulating unit to extract heat from said semiconductor laser element as the detected driving current increases in accordance with said control function.

14. The semiconductor laser device according to claim 11, wherein:
said semiconductor laser element includes an active layer; and
said control function is defined such that a temperature of said active layer remains substantially constant for varying driving currents.

15. The semiconductor laser device according to claim 11, wherein said means for controlling includes a means for storing said control function.

16. The semiconductor laser device according to claim 11, wherein:
said means for controlling further comprises a means for setting a desired wavelength, and a means for storing plural control functions;
said means for controlling is configured to select a new control function from said plural control functions that corresponds to a desired wavelength entered into said means for setting; and
said means for controlling is configured to control said temperature regulating unit according to said new control function.

17. The semiconductor laser device according to claim 11, wherein said control function is common to semiconductor laser devices having similar structure and operation.

18. The semiconductor laser device according to claim 11, wherein said control function is defined by plural temperatures detected by said temperature measuring element and corresponding driving currents detected by said current detecting unit where a substantially constant wavelength output from said semiconductor laser element is maintained.

19. The semiconductor laser device according to claim 11, wherein said control function is a linear function of predetermined temperature versus predetermined driving current.

20. The semiconductor laser device according to claim 11, wherein said control function is a quadratic function of predetermined temperature versus predetermined driving current.

21. The semiconductor laser device according to claim 11, wherein said temperature regulating unit is a Peltier device and said temperature measuring device is a thermistor.

22. A drive control method for a semiconductor laser device, the method comprising the steps of:
determining a control function defined as a relationship between a predetermined driving current and a predetermined temperature to achieve a substantially constant wavelength output from a semiconductor laser element of the semiconductor laser device;
detecting a driving current applied to the semiconductor laser element; and
controlling a temperature regulating unit such that a temperature of the semiconductor laser element detected by a temperature measuring element substantially equals the predetermined temperature corresponding to the detected driving current as defined by the control function,
wherein the semiconductor laser element and the temperature measuring element are thermally connected to the temperature regulating unit, and
wherein the semiconductor laser element includes a diffraction grating to oscillate plural longitudinal modes.

23. The method according to claim 22, wherein the step of determining the control function includes the steps of:
   detecting plural temperatures using the temperature measuring element and detecting corresponding driving currents where a substantially constant wavelength output from the semiconductor laser element is maintained; and
   fitting a curve using the detected plural temperatures and corresponding drive currents.

24. The method according to claim 22, wherein the step of controlling the temperature regulating unit includes controlling the temperature regulating unit to extract heat from the semiconductor laser element as the detected driving current increases in accordance with the control function.

25. The method according to claim 22, further comprising the step of storing the control function within a storage unit.

26. The method according to claim 22, further comprising the steps of:
   storing plural control functions corresponding to different constant wavelengths;
   setting a desired constant wavelength;
   selecting a new control function from the plural control functions that corresponds to the desired constant wavelength; and
   controlling the temperature regulating unit according to the new control function.

27. The method according to claim 22, wherein the control function is a linear function of predetermined temperature versus predetermined driving current.

28. The method according to claim 22, wherein the control function is a quadratic function of predetermined temperature versus predetermined driving current.

29. A drive control method for a semiconductor laser device for controlling a temperature of a semiconductor laser element on a basis of a temperature of the semiconductor laser element detected by a temperature measuring element disposed near the semiconductor laser element thereby controlling a wavelength of a laser beam oscillated by the semiconductor laser element, wherein the semiconductor laser element includes a diffraction grating to oscillate plural longitudinal modes, the method comprising the steps of:
   detecting a driving current applied to the semiconductor laser element;
   acquiring a relationship between driving current and temperature at which the wavelength of the laser beam oscillated by the semiconductor laser element is generally constant; and
   controlling the temperature of the semiconductor laser element so that the detected temperature of the semiconductor laser element and the corresponding detected driving current satisfy the acquired relationship.

30. The method according to claim 29, wherein the relationship is a relationship between the driving current and the temperature of the semiconductor laser element at which a temperature of an active layer the semiconductor laser element is generally constant.

31. A drive control method for a semiconductor laser device for controlling a temperature of a semiconductor laser element on a basis of a temperature of the semiconductor laser element detected by a temperature measuring element disposed near the semiconductor laser element thereby controlling a wavelength of a laser beam oscillated by the semiconductor laser element, wherein the semiconductor laser element includes a diffraction grating to oscillate plural longitudinal modes, the method comprising the steps of:
   detecting a driving current applied to the semiconductor laser element;
   acquiring a plurality of relationships between driving current and temperature in which the wavelength of the laser beam oscillated by the semiconductor laser element is generally constant;
   setting a desired wavelength;
   changing from a present relationship to a new relationship corresponding to the desired wavelength; and
   controlling a temperature of the semiconductor laser element so that the detected temperature and the corresponding detected driving current satisfy the new relationship.

32. A semiconductor laser device comprising:
   a semiconductor laser element;
   a temperature measuring element to measure a temperature of said semiconductor laser element;
   a mounting structure having a first portion thermally connected to said semiconductor laser element, said mounting structure having a second portion thermally connected to said temperature measuring element, whereby said temperature measuring element indirectly measures a temperature of said semiconductor laser element via heat transfer through said mounting structure;
   a temperature regulating unit thermally connected to said mounting structure;
   a current detecting unit to detect a driving current applied to said semiconductor laser element; and
   a control unit to control said temperature regulating unit by a control function to achieve a substantially constant wavelength output from said semiconductor laser element, said control function defining a relationship between a predetermined driving current and a predetermined temperature, said control unit being electrically connected to said temperature measuring element, said temperature regulating unit, and said current detecting unit to control said temperature regulating unit such that the temperature detected by said temperature measuring element substantially equals the predetermined temperature corresponding to the detected driving current as defined by said control function.

33. A semiconductor laser device comprising:
   a semiconductor laser element;
   a temperature measuring element to measure a temperature of said semiconductor laser element;
   a mounting structure having a first portion thermally connected to said semiconductor laser element, said mounting structure having a second portion thermally connected to said temperature measuring element, whereby said temperature measuring element indirectly measures a temperature of said semiconductor laser element via heat transfer through said mounting structure;
   a temperature regulating unit thermally connected to said mounting structure;
   a means for detecting a driving current applied to said semiconductor laser element; and
   a means for controlling said temperature regulating unit using a control function to achieve a substantially constant wavelength output from said semiconductor laser element,
   wherein said means for controlling is electrically connected to said temperature measuring element, said temperature regulating unit, and said means for detecting.

34. A drive control method for a semiconductor laser device, the method comprising the steps of:
   determining a control function defined as a relationship between a predetermined driving current and a predetermined temperature to achieve a substantially constant wavelength output from a semiconductor laser element of the semiconductor laser device;
   detecting a driving current applied to the semiconductor laser element; and
   controlling a temperature regulating unit such that a temperature of the semiconductor laser element detected by a temperature measuring element substantially equals the predetermined temperature corresponding to the detected driving current as defined by the control function,
   wherein the semiconductor laser element is thermally connected to a first portion of a mounting structure and the temperature measuring element is thermally connected to a second portion of the mounting structure, and wherein the temperature regulating unit is thermally connected to the mounting structure, whereby the temperature measuring element indirectly measures the temperature of the semiconductor laser element via heat transfer through the mounting structure.

35. A drive control method for a semiconductor laser device for controlling a temperature of a semiconductor laser element on a basis of a temperature of the semiconductor laser element indirectly detected by a temperature measuring element disposed near the semiconductor laser element via heat transfer through a mounting structure thermally connected to both the semiconductor laser element and the temperature measuring element thereby controlling a wavelength of a laser beam oscillated by the semiconductor laser element, the method comprising the steps of:
   detecting a driving current applied to the semiconductor laser element;
   acquiring a relationship between driving current and temperature at which the wavelength of the laser beam oscillated by the semiconductor laser element is generally constant; and
   controlling the temperature of the semiconductor laser element so that the detected temperature of the semiconductor laser element and the corresponding detected driving current satisfy the acquired relationship.

36. A drive control method for a semiconductor laser device for controlling a temperature of a semiconductor laser element on a basis of a temperature of the semiconductor laser element indirectly detected by a temperature measuring element disposed near the semiconductor laser element via heat transfer through a mounting structure thermally connected to both the semiconductor laser element and the temperature measuring element thereby controlling a wavelength of a laser beam oscillated by the semiconductor laser element, the method comprising the steps of:
   detecting a driving current applied to the semiconductor laser element;
   acquiring a plurality of relationships between driving current and temperature in which the wavelength of the laser beam oscillated by the semiconductor laser element is generally constant;
   setting a desired wavelength;
   changing from a present relationship to a new relationship corresponding to the desired wavelength; and
   controlling a temperature of the semiconductor laser element so that the detected temperature and the corresponding detected driving current satisfy the new relationship.

* * * * *